(12) United States Patent
Okumura

(10) Patent No.: US 11,215,747 B2
(45) Date of Patent: Jan. 4, 2022

(54) LIGHT SOURCE DEVICE AND ELECTRONIC APPARATUS

(71) Applicant: SEIKO EPSON CORPORATION, Tokyo (JP)

(72) Inventor: Osamu Okumura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 104 days.

(21) Appl. No.: 16/699,341

(22) Filed: Nov. 29, 2019

(65) Prior Publication Data
US 2020/0174177 A1 Jun. 4, 2020

(30) Foreign Application Priority Data

Nov. 30, 2018 (JP) .............................. JP2018-225805
Oct. 23, 2019 (JP) .............................. JP2019-192540

(51) Int. Cl.
*F21V 8/00* (2006.01)
*H01L 33/50* (2010.01)
*F21K 9/64* (2016.01)

(52) U.S. Cl.
CPC .............. *G02B 6/0068* (2013.01); *F21K 9/64* (2016.08); *G02B 6/0073* (2013.01); *H01L 33/505* (2013.01); *H01L 33/507* (2013.01)

(58) Field of Classification Search
CPC ....... G02B 6/0068; G02B 6/0073; F21K 9/64; H01L 33/505; H01L 33/507
See application file for complete search history.

(56) References Cited

U.S. PATENT DOCUMENTS

| 10,920,939 B2 * | 2/2021 | Haenen ...................... F21K 9/68 |
| 2009/0078949 A1 * | 3/2009 | Bechtel ................ G02B 6/0003 |
| | | 257/98 |

FOREIGN PATENT DOCUMENTS

| CN | 108139535 A | * | 10/2016 |
| JP | 2008-521233 A | | 6/2008 |
| JP | 2016-521438 A | | 7/2016 |
| WO | 2006/054203 A1 | | 5/2006 |
| WO | 2014/155250 A1 | | 10/2014 |
| WO | WO-2019008017 A1 | * | 1/2019 |

* cited by examiner

*Primary Examiner* — Mary Ellen Bowman
(74) *Attorney, Agent, or Firm* — Oliff PLC

(57) ABSTRACT

A light source device according to the present disclosure includes a light-emitting body configured to emit first wavelength range light, a wavelength converter that includes an incident surface on which the first wavelength range light is incident, and an emission surface configured to convert the first wavelength range light to second wavelength range light and subsequently emit, and for which the incident surface is set to be larger than the emission surface, a light collector including a light input part configured to enter the second wavelength range light, and a scattering part disposed on the emission surface of the wavelength converter or on a side closer to the light collector than the emission surface, wherein the light collector includes a reflective layer configured to reflect the second wavelength range light entered by the light input part.

6 Claims, 6 Drawing Sheets

LIGHT SOURCE DEVICE AND ELECTRONIC APPARATUS

The present application is based on and claims priority from JP Application Serial Number 2018-225805, filed Nov. 30, 2018, and JP Application Serial Number 2019-192540, filed Oct. 23, 2019, the disclosure of which is hereby incorporated by reference herein in its entirety.

BACKGROUND

1. Technical Field

The present disclosure relates to a light source device and an electronic apparatus.

2. Related Art

In recent years, lighting or light source devices having excellent energy efficiency are required to be developed in terms of energy saving or the like, and a light source device using a solid light source such as a light-emitting diode (LED) or a semiconductor laser (LD) has been proposed.

Here, when an LED is applied to a light source device included in a projector, for example, and large power is inputted into one LED to obtain large light flux enough to be usable for a projector by the one LED, light emission efficiency decreases due to a droop phenomenon. Thus, in this case, a method of expanding a light-emitting area of the light source device, such as increasing the number of LEDs included in the light source device is generally adopted.

However, efficiency of illuminating a display device such as a liquid crystal or a digital mirror device (DMD) in a projector is increased as entendu=light-emitting area×solid angle is set to be smaller. As a result, when achievement of high brightness of a projector is attempted with a plurality of LEDs, there has been a problem to face with a dilemma caused by expansion of light flux due to enlargement of the light-emitting area, and a decrease in illumination efficiency due to an increase in the etendue.

As a means to solve this problem, a technology referred to as so-called HLD (High Lumen Density) that realizes high brightness without increasing the etendue is proposed in JP-T-2016-521438, for example, by using a principle of fluorescent focusing that applies fluorescence conversion to light emitted by a plurality of LEDs and focuses the light applied with the fluorescence conversion into a small area.

However, in this HLD technology, due to low extraction efficiency of extracting the light applied with the fluorescence conversion, energy efficiency lowers, and as a result, there has been a problem that, for example, power consumed by a lighting device increases, and a cooling mechanism for cooling generated heat needs to be provided, thereby leading to an increase in size of the lighting device.

SUMMARY

The disclosure is made to address the above-described issues, and can be realized as the following application examples.

A light source device according to an application example of the present disclosure includes a light-emitting body configured to emit first wavelength range light, a wavelength converter that includes an incident surface on which the first wavelength range light is incident, and an emission surface configured to convert the first wavelength range light to second wavelength range light and subsequently emit, and for which the incident surface is larger than the emission surface, a light collector including a light input part configured to enter the second wavelength range light, and a scattering part disposed on the emission surface of the wavelength converter or on a side closer to the light collector than the emission surface, wherein the light collector includes a reflective layer configured to reflect the second wavelength range light entered by the light input part.

DESCRIPTION OF EXEMPLARY EMBODIMENTS

Alight source device and an electronic apparatus according to an aspect of the present disclosure will be described in detail below based on preferable exemplary embodiments illustrated in the accompanying drawings.

Light Source Device

First Exemplary Embodiment

Figure 1:
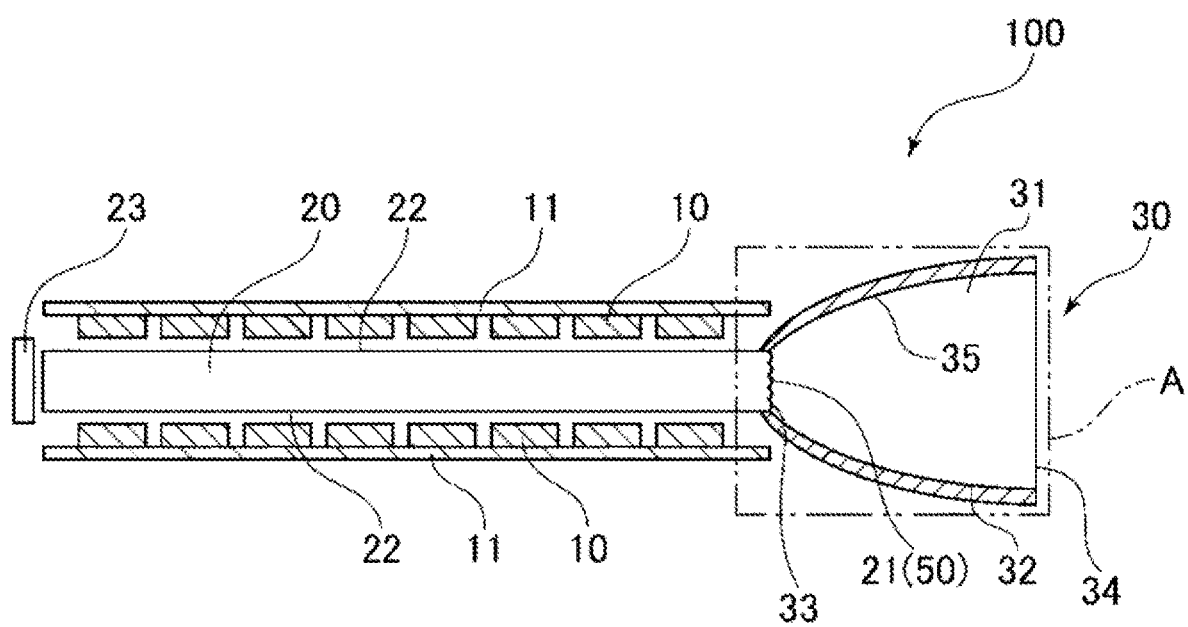
FIG. 1 is a cross-sectional view schematically illustrating a light source device according to a first exemplary embodiment of the present disclosure.
Figure 2:
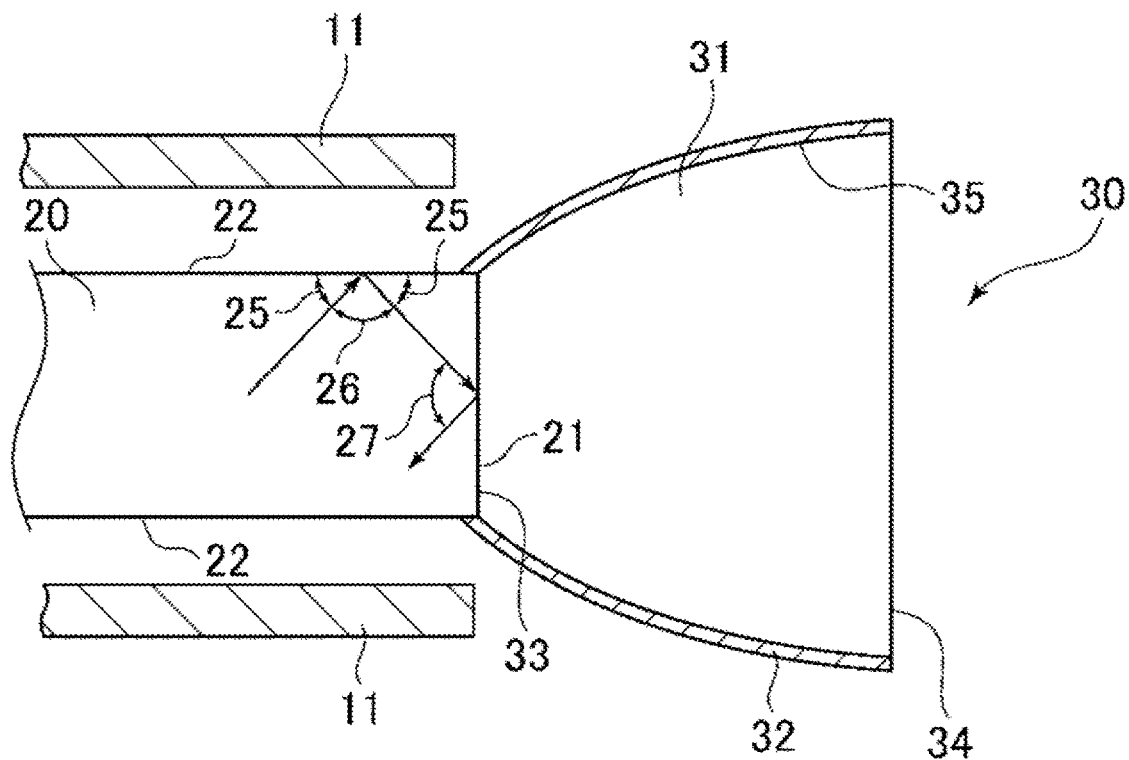
FIG. 2 is an enlarged cross-sectional view enlarging and illustrating a configuration of a part A of the light source device illustrated in FIG. 1 with formation of a scattering part omitted.

FIG. 1 is a cross-sectional view schematically illustrating a light source device according to a first exemplary embodiment of the present disclosure, and FIG. 2 is an enlarged cross-sectional view enlarging and illustrating a configuration of a part A of the light source device illustrated in FIG. 1. Note that, in the following, for convenience of explanation, an upper side in each of FIG. 1 and FIG. 2 is described as a "top", a lower side as a "bottom", a left side as a "base end", and a right side as a "tip".

A light source device 100 is a device to which a technology referred to as so-called HLD (High Lumen Density) is applied that realizes high brightness without increasing etendue, by using a principle of fluorescent focusing that applies fluorescence conversion to light emitted by a light-emitting body 10 such as a plurality of LEDs and focuses the light applied with the fluorescence conversion into a small area.

In the present exemplary embodiment, as illustrated in FIG. 1, the light source device 100 includes a plurality of the light-emitting bodies 10 that emit first wavelength range light, the wavelength converter 20 that converts the first wavelength range light into second wavelength range light, the light collector 30 that includes a light input part 33 that enters the second wavelength range light, and a scattering part 50 disposed on the emission surface 21 included in the wavelength converter 20. In the light source device 100 having the above configuration, the light collector 30 includes a main body 32 with an entire shape thereof forming a cylindrical shape, an open part on a base end side constitutes the light input part 33, an open part on a tip side constitutes an output part 34 for emitting the second wavelength range light, and the main body 32 is provided with a reflective layer 35 for reflecting the second wavelength range light entered by the light input part 33.

In the light source device 100 described above, the scattering part 50 is disposed between the emission surface 21 of the wavelength converter 20 and the light input part 33 of the light collector 30. Then, by configuring the main body 32 included in the light collector 30 to form the cylindrical shape, an internal space is formed in the inner part 31 thereof, and as a result, a refractive index of the inner part 31 is set to be 1.0, that is, small. Accordingly, a larger amount of the second wavelength range light can be extracted from the wavelength converter 20 into the light input part 33, that is, extraction efficiency of the second wavelength range light from the wavelength converter 20 to the light input part 33 can be improved. Further, the main body 32 includes the reflective layer 35, thus the second wavelength range light can be emitted from the output part 34, by making this reflective layer 35 reflect the second wavelength range light from the wavelength converter 20.

Hereinafter, a configuration of each part included in the light source device 100 will be described sequentially.

Light-Emitting Body 10

The light-emitting body 10 is a light source in the light source device 100, and in the present disclosure, emits the first wavelength range light.

The plurality of light-emitting bodies 10 are mounted on a circuit board 11 included in the light source device 100. In other words, in the present exemplary embodiment, eight number of the light-emitting bodies 10 are mounted on each of a pair of the circuit boards 11 arranged to face each other in a vertical direction via the wavelength converter 20, and the light source device 100 includes a total of 16 number of the light-emitting bodies 10. Accordingly, the first wavelength range light emitted by the light-emitting body 10 is radiated to an upper portion and a lower portion of the wavelength converter 20.

Examples of the light-emitting body 10 include, for example, a solid light source such as a light-emitting diode (LED), a semiconductor laser (LD), or an organic EL element (OLED), and one or two or more types of these can be used in combination, but among these, the LED may be used. The LED can emit light having a desired first wavelength range with relatively high efficiency, thus may be used as the light-emitting body 10.

Examples of the first wavelength range include, a case of emitting light in a UV or violet color gamut defined as a wavelength window less than 420 nm, a case of emitting light in a blue color gamut defined as a wavelength window equal to or more than 420 nm and equal to or less than 495 nm, a case of emitting light in a green/yellow color gamut defined as a wavelength window equal to or more than 495 nm and equal to or less than 600 nm, a case of emitting light in a red color gamut defined as a wavelength window equal to or more than 600 nm and equal to or less than 800 nm, a case of emitting light in a near-infrared range defined as a wavelength window equal to or more than 810 nm and equal to or less than 850 nm, and the like, and depending on the above wavelength windows, light sources such as LEDs that emit various colors are selected and used as the light-emitting body 10.

Note that, since the LD, currently and widely used, is an end face emission type, for example, when this is used as a light source of a projector, after light of a plurality of LDs is combined and homogenized with an optical system, a display device such as an LCD or a DMD needs to be illuminated as a face. Compared to this, by using the LD as the light-emitting body 10, the LD can be used as the light source for the projector without using the optical system.

Additionally, the OLED is a light source that is easy to be increased in area. Thus, by using the OLED as the light-emitting body 10, as illustrated in FIG. 1, it is not necessary to provide eight number of the light-emitting bodies 10 on one number of the circuit board 11, for example, and one number of the light-emitting body 10 may be used as a light source that emits the first wavelength range light to the wavelength converter 20.

Wavelength Converter 20

The wavelength converter 20 includes the incident surface 22 on which the first wavelength range light is incident, and the emission surface 21 that emits the second wavelength range light. The wavelength converter 20 functions as a wavelength conversion element for converting the first wavelength range light emitted from the light-emitting body 10 to the second wavelength range light, and also functions as an optical waveguide for guiding the first wavelength range light incident from the incident surface 22 to the emission surface 21.

In this wavelength converter 20, when the incident surface 22 on which the first wavelength range light is incident is compared to the emission surface 21 that converts the first wavelength range light to the second wavelength range light, and subsequently emits, the incident surface 22 is set to be larger than the emission surface 21. In other words, a total area S1 of the incident surface 22 and a total area S2 of the emission surface 21 may satisfy a relationship S1>S2, and S1>2×S2. When a relationship between a size of the incident surface 22 on which the first wavelength range light is incident, and a size of the emission surface 21 that emits the second wavelength range light satisfy the above described relationship, the second wavelength range light converted from the first wavelength range light can be emitted from the emission surface 21, by setting etendue (=light-emission area×solid angle) to be set small rather than increasing. Thus, extraction efficiency of light in the light source device 100 can be improved.

The above wavelength converter 20 is, in order for the size of the incident surface 22 to be larger than the size of the emission surface 21, constituted by a light guide having transparency, such that an overall shape forms a rodlike long object, for example, and light can transmit inside thereof. Then, the wavelength converter 20 contains a luminescent material such that conversion of the first wavelength range light to the second wavelength range light can be achieved, by irradiation with the first wavelength range light to emit the second wavelength range light.

In the wavelength converter 20, a ratio of a length of the incident surface 22 (length in a left-right direction in FIG. 1) to a height of the emission surface 21 (length in an up-down direction in FIG. 1), as illustrated in FIG. 1, may satisfy approximately, 2:1 to 100:1, more preferably satisfies approximately, 30:1 to 70:1. This makes it possible to more reliably prevent an increase in the etendue. In addition, a shape in plan view of the emission surface 21 is not particularly limited, but examples include, for example, a circular shape such as a true circular shape or an elliptical shape, or a polygonal shape such as a triangle, a square, a rectangle, a pentagon, or a hexagon.

A main material constituting the wavelength converter 20 is not particularly limited as long as the main material has transparency, but examples include, for example, an undoped transparent garnet such as YAG and LuAG, and a polymeric material having optical transparency, in addition to glass such as borosilicate glass, and quartz, sapphire, and polycrystalline alumina, and one or two or more of the above materials can be used in combination. By appropriately combining the above materials, the wavelength converter 20 having a refractive index n approximately equal to or more than 1.5 and equal to or less than 1.8 can be obtained, and it is possible to set the refractive index greater than that of an inner part 31 of the light collector 30.

Furthermore, examples of the luminescent material included in the wavelength converter 20 include, for example, organic fluorescent materials, in addition to inorganic phosphors such as doped YAG, LuAG, and the like, such as yellow-emitting YAG:Ce (cerium-doped yttrium aluminum garnet) and green-emitting LuAG:Ce (cerium-doped lutetium aluminum garnet). By selecting the luminescent material, a scope of a second wavelength range of light emitted by irradiation with the first wavelength range light can be set. In other words, a color tone of light emitted from the emission surface 21 of the wavelength converter 20 can be set.

The first wavelength range light emitted from the plurality of light-emitting bodies 10 enters, into the wavelength converter 20 having the above configuration, and the luminescent material included in the wavelength converter 20 makes the light converted to the second wavelength range luminous. At this time, the second wavelength range light made to be luminous by the luminescent material is radiated in all directions in the wavelength converter 20. Then, as illustrated in FIG. 2, of light that reaches the incident surface 22, light incident at an angle in a transmission angle range 26 passes through the incident surface 22, is emitted outward the wavelength converter 20, and light incident at an angle in a total reflection angle range 25 is totally reflected at the incident surface 22. Thereafter, when it is assumed that the emission surface 21 is constituted by a planar surface, of the light totally reflected, light incident on the emission surface 21 at an angle in a light guide angle range 27 passes through the emission surface 21 and is emitted inward the light collector 30.

Additionally, the light source device 100 includes a mirror 23 outside an end surface of the rodlike wavelength converter 20 opposite to the emission surface 21. In this way, of the second wavelength range light made to be luminous by the luminescent material contained in the wavelength converter 20, light emitted from the end surface opposite to the emission surface 21 can be reflected by the mirror 23 to be introduced into the wavelength converter 20 again. Note that, as illustrated in FIG. 1, the mirror 23 may be provided separately from the wavelength converter 20, or may be formed integrally with the wavelength converter 20.

Furthermore, the light source device 100 may include a mirror (not illustrated) outside a side surface different from the incident surface 22 of the rodlike wavelength converter 20. Accordingly, of the second wavelength range light made to be luminous by the luminescent material contained in the wavelength converter 20, light emitted from a side surface different from the incident surface 22 can be reflected by the mirror to be introduced into the wavelength converter 20 again. Note that, the mirror may be provided separately from the wavelength converter 20, or may be formed integrally with the wavelength converter 20.

Light Collector 30

The light collector 30 collects the second wavelength range light emitted from the emission surface 21 of the wavelength converter 20, and emits or radiates this second wavelength range light to an object to be irradiated by the light source device 100.

In the present exemplary embodiment, as illustrated in FIG. 1, the light collector 30 includes a main body 32 with an entire shape thereof forming a cylindrical shape, an open part on a base end side constitutes the light input part 33, an open part on a tip side constitutes an output part 34 for emitting or radiating the second wavelength range light, and an inner circumferential surface of the main body 32 having the inner part 31 constituting an internal space, is provided with a reflective layer 35 for reflecting the second wavelength range light entered by the light input part 33. In other words, the light collector 30 forms reflector structure constituted by the main body 32 and the reflective layer 35.

The light collector 30 having the above configuration is disposed such that the light input part 33 that is the open part on the base end side of the light collector 30 corresponds to the emission surface 21 included in the wavelength converter 20. Accordingly, the second wavelength range light emitted from the emission surface 21 of the wavelength converter 20 is guided from the light input part 33 to the inner part 31 of the main body 32.

The main body 32 has a shape in which an inner diameter thereof gradually increases as a distance from a base end toward a tip increases, that is, from the light input part 33 toward the output part 34. In other words, the inner circumferential surface of the main body 32 is constituted by a curved surface that forms a funnel shape, that is, an inclined surface that forms a tapered shape. Additionally, the reflective layer 35 is formed at the inner circumferential surface of the main body 32.

Thus, by reflecting the second wavelength range light emitted from the emission surface 21 of the wavelength converter 20, which is introduced into the inner part 31 of the main body 32 via the light input part 33, by the reflective layer 35 toward the output part 34, and after this reflection, it is possible to release or radiate the light to a target object located outside the light source device 100, from the output part 34. Thus, a radiation angle of the second wavelength range light released from the output part 34 can be narrowed.

Note that, when a shape in plan view of the emission surface 21 of the wavelength converter 20 forms a circle, the main body 32 may be constituted by a composite parabola type light collector (CPC: Compound Parabolic Concentrator). This makes it possible to more reliably narrow the radiation angle of the second wavelength range light emitted from the output part 34. In addition, when the shape in plan view of the emission surface 21 forms a circle, the emission surface 21 may be disposed on the light input part 33, that is, the open part on the base end side of the light collector 30 such that an edge portion of the emission surface 21 coincides with a focal position of the CPC. With this, the above-mentioned effect can be exerted more prominently.

A constituent material of the main body 32 is not particularly limited, but, for example, identical materials to those listed as the main material constituting the wavelength converter 20 can be used. Among others, a material having a low coefficient of thermal expansion such as quartz or borosilicate glass may be used. Accordingly, even when the main body 32 is heated by the second wavelength range light reflected on the reflective layer 35, deformation of the main body 32 due to this heating can be adequately suppressed or prevented.

Note that, when such a constituent material is used, the main body portion 32 can be made to have transparency. Thus, as illustrated in FIG. 1, the reflective layer 35 may be formed at an outer circumferential surface of the main body 32, rather than being formed at the inner circumferential surface of the main body 32.

In addition, the reflective layer 35 can be constituted by a metal mirror containing a metal material such as Ag or Al as a main material, or a dielectric multilayer film mirror, for example.

Furthermore, the above described reflective layer 35 may include a dielectric layer or the like on a topmost surface as a protective layer.

Furthermore, in the present exemplary embodiment, the case where the inner part 31 is constituted by the internal space, that is, air is present as a filler in the inner part 31, but the present exemplary embodiment is not limited to such a configuration, and the inner part 31 may be filled with a filler with optical transparency other than air.

When air is present in the inner part 31, a refractive index (n) of the inner part 31 is set to 1.0, but including this case, it is sufficient that the refractive index of the inner part 31 is smaller than that of the wavelength converter 20. Specifically, the refractive index may be equal to or more than 1.0 and equal to or less than 1.4, and more preferably, equal to or more than 1.1 and equal to or less than 1.3. Accordingly, the extraction efficiency of light in the light source device 100 can be further improved.

Note that, a reason that the refractive index of the filler may be set within the above-described range will be described in detail in the following Working Examples.

Furthermore, a constituent material of the filler is not particularly limited as long as the material has optical transparency, but, for example, examples include aerogel (n=1.01 to 1.10), a polymeric material (n=around 1.3) such as Teflon (registered trademark) (n=1.29), water (n=1.33), and the like, and one or two or more of these can be used in combination.

Furthermore, when the inner part 31 of the light collector 30 is filled with such a filler, and the filler is a solid material with a moderate strength, the light collector 30 may have a configuration in which formation of the main body 32 is omitted.

Also, when the open part on the tip side or the output part 34 is sealed and air is present in the inner part 31, the inner part 31 may be in a state with reduced pressure or in a vacuum state.

Scattering Part 50

A scattering part 50 is disposed on the emission surface 21 of the wavelength converter 20 or closer to the light collector 30 than the emission face 21, and improves scattering properties or diffusion properties of the second wavelength range light. Accordingly, it is possible to improve the extraction efficiency of the second wavelength range light from within the wavelength converter 20 to an outside thereof via the emission surface 21.

In the present exemplary embodiment, as illustrated in FIG. 1, the scattering part 50 is integrally formed with the wavelength converter 20, and an upper surface of the emission surface 21, that is, the emission surface 21 itself constitutes the scattering part 50.

In this case, the scattering part 50 or the emission surface 21 is constituted by, for example, a micro lens, a lenticular lens, a prism, a scattering bead layer, diffraction grating, random recesses and protrusions, and the like. Accordingly, the second wavelength range light reaching the emission surface 21 within the wavelength converter 20 can be diffused, and as a result, the extraction efficiency of the second wavelength range light from the wavelength converter 20 is improved.

In addition, a degree of scattering the second wavelength range light at the scattering part 50 or the emission surface 21 can be defined, for example, by haze (a haze value; opacity), and haze measured in accordance with JIS K 7136 may be equal to or more than 5% and equal to or less than 85%, and more preferably equal to or more than 15% and equal to or less than 60%. By setting a haze size within the above ranges, extraction of the second wavelength range light from the wavelength converter 20 can be performed with more excellent efficiency.

Note that, a reason that the haze size may be set within the above-described range will be described in detail in the following Working Examples.

In addition, as in the present exemplary embodiment, the scattering part 50 need not be formed integrally with the wavelength converter 20, but may be formed separately from the wavelength converter 20. In this case, it is sufficient that the scattering part 50 constituted by a micro lens, a lenticular lens, a prism, a scattering bead layer, diffraction grating, random recesses and protrusions, or the like is disposed, in a state in contact with the emission surface 21 constituted by a planar surface, or in a state of being separated toward the tip side for a micro distance, for example, with an intermediate layer interposed therebetween. In addition, respective refractive indice of the wavelength converter 20 and the scattering part 50 may have a difference, but may be approximately identical. Accordingly, the second wavelength range light can be handed over from the wavelength converter 20 to the scattering part 50 more smoothly.

According to the light source device 100 of the present exemplary embodiment as described above, the light source device 100 can be said to be a light source having excellent energy efficiency, because the second wavelength range light can be extracted from the wavelength converter 20 included in the light source device 100 to the light collector 30 with high extraction efficiency. In addition, since it is not necessary to provide a cooling mechanism for cooling generated heat, the light source device 100 can be a light source for which miniaturization is realized.

Second Exemplary Embodiment

Next, a second exemplary embodiment of the light source device of the present disclosure will be described.

Figure 3:
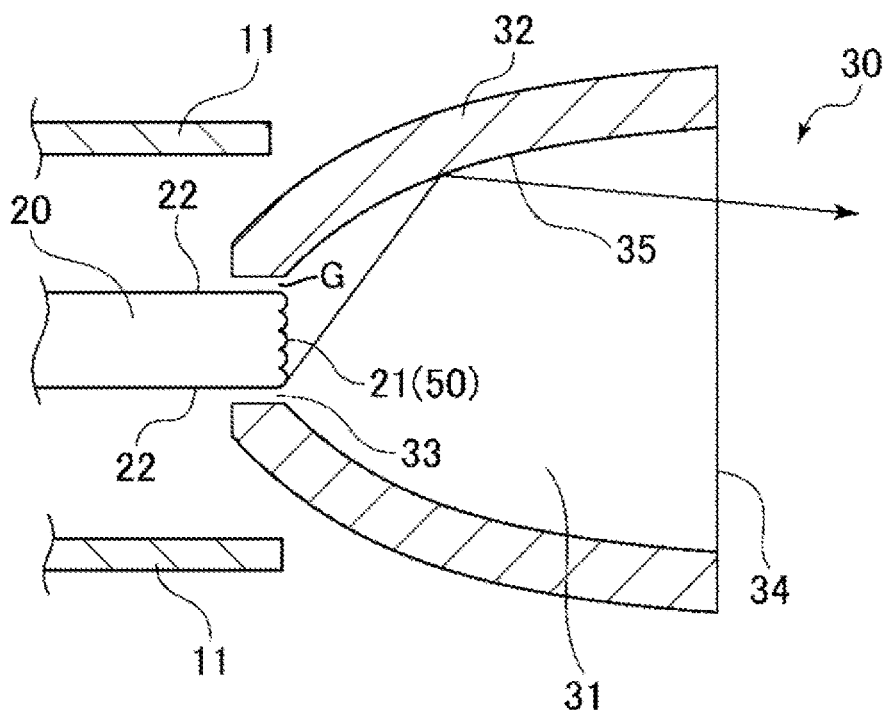
FIG. 3 is an enlarged cross-sectional view enlarging and illustrating a configuration of a part A of a light source device according to a second exemplary embodiment of the present disclosure.

FIG. 3 is an enlarged cross-sectional view enlarging and illustrating a configuration of a part A of a light source device according to a second exemplary embodiment of the present disclosure.

Hereinafter, differences between the light source device 100 according to the second exemplary embodiment and the light source device according to the first exemplary embodiment will be mainly described, and description on similar matters will be omitted.

The light source device 100 of the second exemplary embodiment is similar to the light source device of the first exemplary embodiment, except that a position at which the light collector 30 is disposed with respect to the wavelength converter 20 is different.

In other words, in the light source device 100, the light input part 33 is disposed so as to correspond to the emission surface 21 included in the wavelength converter 20, but in the light source device 100 of the second exemplary embodiment, as illustrated in FIG. 3, at the light input part 33 or the open part on the base end side of the light collector 30, a gap G is formed between the main body 32 and the wavelength converter 20 so that the main body 32 and the wavelength converter 20 do not come into contact with each other, more specifically, so that a base end portion of the main body 32 on a side of the light input part 33 and the incident surface 22 of the wavelength converter 20 do not come into contact with each other. This gap G is formed around an entire periphery of the base end portion of the main body 32.

In this way, even when the main body 32 is transmissive, an end portion of the main body 32 on the side of the light input part 33 and the incident surface 22 of the wavelength converter 20 do not come into contact with each other. Accordingly, it is possible to adequately prevent the second wavelength range light from being guided into the main body 32 without being totally reflected by the incident surface 22 in the wavelength converter 20. Thus, a decrease in the extraction efficiency of light in the light source device 100 due to the second wavelength range light being guided into the main body 32 can be adequately prevented.

The above-described light source device 100 according to the second exemplary embodiment can also provide benefit similar to that of the first exemplary embodiment.

Third Exemplary Embodiment

Next, a third exemplary embodiment of the light source device according to the present disclosure will be described.

Figure 4:
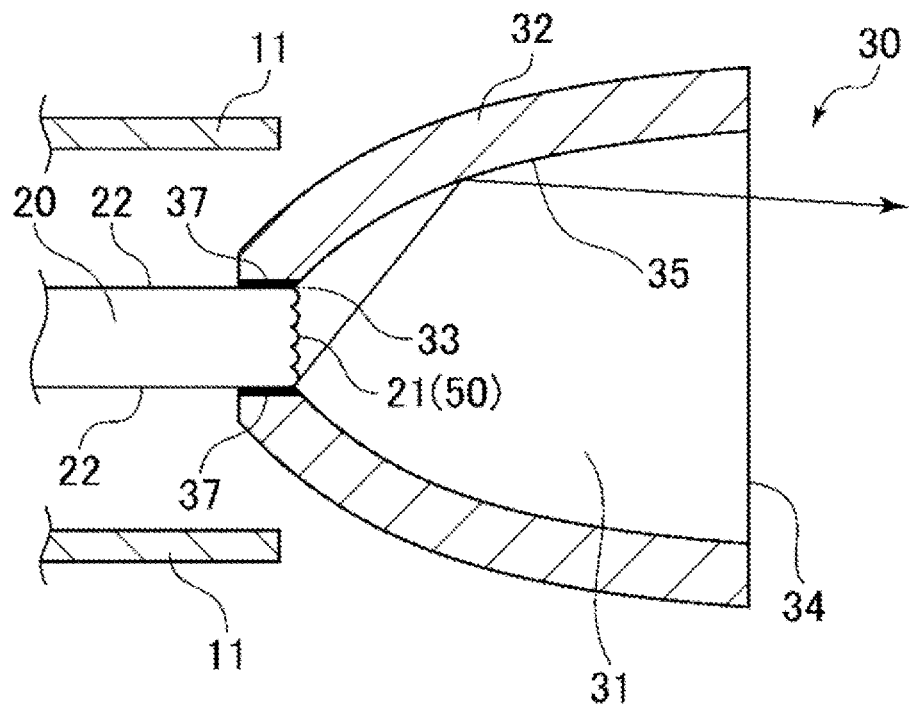
FIG. 4 is an enlarged cross-sectional view enlarging and illustrating a configuration of a part A of a light source device according to a third exemplary embodiment of the present disclosure.

FIG. 4 is an enlarged cross-sectional view enlarging and illustrating a configuration of a part A of a light source device according to the third exemplary embodiment of the present disclosure.

Hereinafter, differences between the light source device 100 according to the third exemplary embodiment and the light source device according to the first exemplary embodiment will be mainly described, and description on similar matters will be omitted.

The light source device 100 of the third exemplary embodiment is similar to the light source device of the first exemplary embodiment, except that a configuration of the light collector 30 disposed with respect to the wavelength converter 20 is different.

In other words, in the light source device 100, the light input part 33 is disposed so as to correspond to the emission surface 21 included in the wavelength converter 20, but in the light source device 100 of the third exemplary embodiment, as illustrated in FIG. 4, at the light input part 33 or the open part on the base end side of the light collector 30, the light collector 30 and the wavelength converter 20 come into contact with each other. In this manner, although the light collector 30 and the wavelength converter 20 come into contact with each other, in the present exemplary embodiment, the light collector 30 includes a reflective layer 37 that covers the end portion of the main body 32 on the side of the light input part 33. As a result, the end portion of the main body 32 on the side of the light input part 33 and the incident surface 22 of the wavelength converter 20 can be brought into contact with each other via the reflective layer 37 without being brought into direct contact with each other.

In this way, even when the main body 32 is transmissive, since the end portion of the main body 32 on the side of the light input part 33 and the incident surface 22 of the wavelength converter 20 come in contact with each other via the reflective layer 37, it is possible to adequately prevent the second wavelength range light from being guided in the main body 32 without being totally reflected by the incident surface 22 in the wavelength converter 20. Thus, a decrease in the extraction efficiency of light in the light source device 100 due to the second wavelength range light being guided into the main body 32 can be adequately prevented.

The above-described light source device 100 according to the third exemplary embodiment can also provide benefit similar to that of the first exemplary embodiment.

Fourth Exemplary Embodiment

Next, a fourth exemplary embodiment of the light source device according to the present disclosure will be described.

Figure 5:
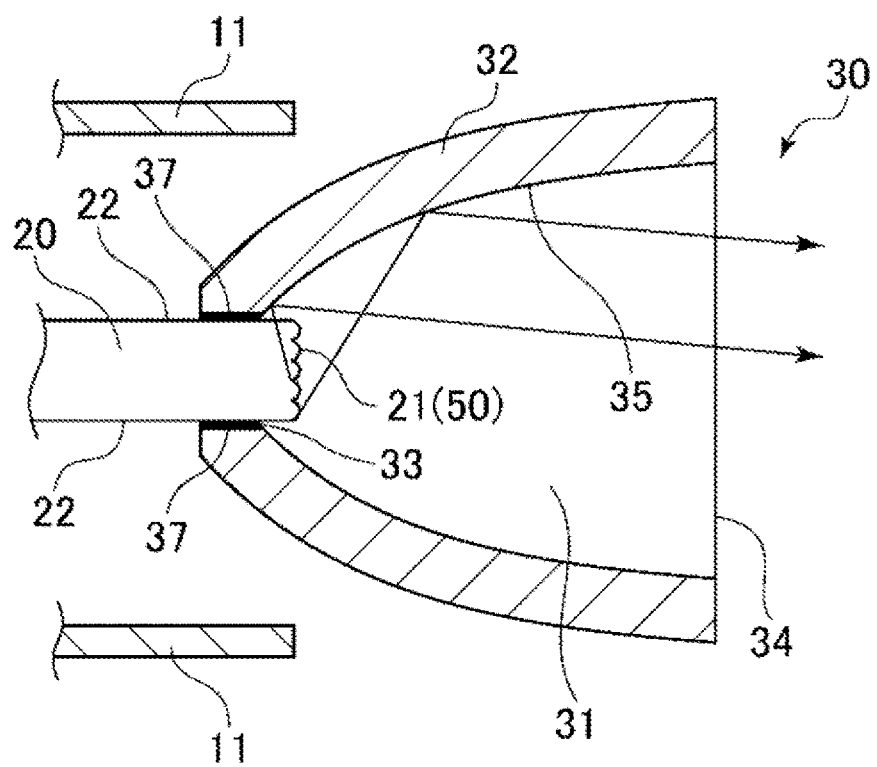
FIG. 5 is an enlarged cross-sectional view enlarging and illustrating a configuration of a part A of a light source device according to a fourth exemplary embodiment of the present disclosure.

FIG. 5 is an enlarged cross-sectional view enlarging and illustrating a configuration of a part A of a light source device according to a fourth exemplary embodiment of the present disclosure.

Hereinafter, differences between the light source device 100 according to the fourth exemplary embodiment and the light source device according to the third exemplary embodiment will be mainly described, and description on similar matters will be omitted.

The light source device 100 of the fourth exemplary embodiment is similar to the light source device of the third exemplary embodiment, except that a position at which the light collector 30 is disposed with respect to the wavelength converter 20 is different.

In other words, in the light source device 100, the light input part 33 is disposed so as to correspond to the emission surface 21 included in the wavelength converter 20, but in the light source device 100 of the fourth exemplary embodiment, as illustrated in FIG. 5, the wavelength converter 20 passes through the light input part 33 or the open part on the base end side of the light collector 30, and the emission surface 21 or an end portion of the wavelength converter 20 on a side of the light collector 30 side is located in the inner part 31 or in an inside of the main body 32.

Here, by constituting the emission surface 21 included in the wavelength converter 20 by the scattering part 50, part of the second wavelength range light scattered by the emission surface 21 is reflected back into the wavelength converter 20 without being emitted to a side of the light collector 30. Of the light directed toward a side of the incident surface 22, particularly, light reflected at a vicinity of an end portion of the incident surface 22 on a side of the emission surface 21 highly tends to leak outward the wavelength converter 20 without being totally reflected. Thus, as illustrated in FIG. 5, by locating the emission surface 21 on an inner side of the inner part 31, the second wavelength range light leaking at the vicinity of the end portion of the incident surface 22 on the side of the emission surface 21 is introduced into the inner part 31, thus this light can also be used as the second wavelength range light emitted from the light collector 30, and the second wavelength range light can be extracted from the light source device 100 with higher extraction efficiency.

The above-described light source device according to the fourth exemplary embodiment can also provide benefit similar to those of the first exemplary embodiment and the third exemplary embodiment.

The above described light source device 100 can be incorporated as a light source included in various electronic apparatuses.

Liquid Crystal Projector

Hereinafter, as an example of the electronic apparatus of the present disclosure, a liquid crystal projector in which the light source device 100 is used in a light source that emits yellow light as the second wavelength range light will be described.

Figure 6:
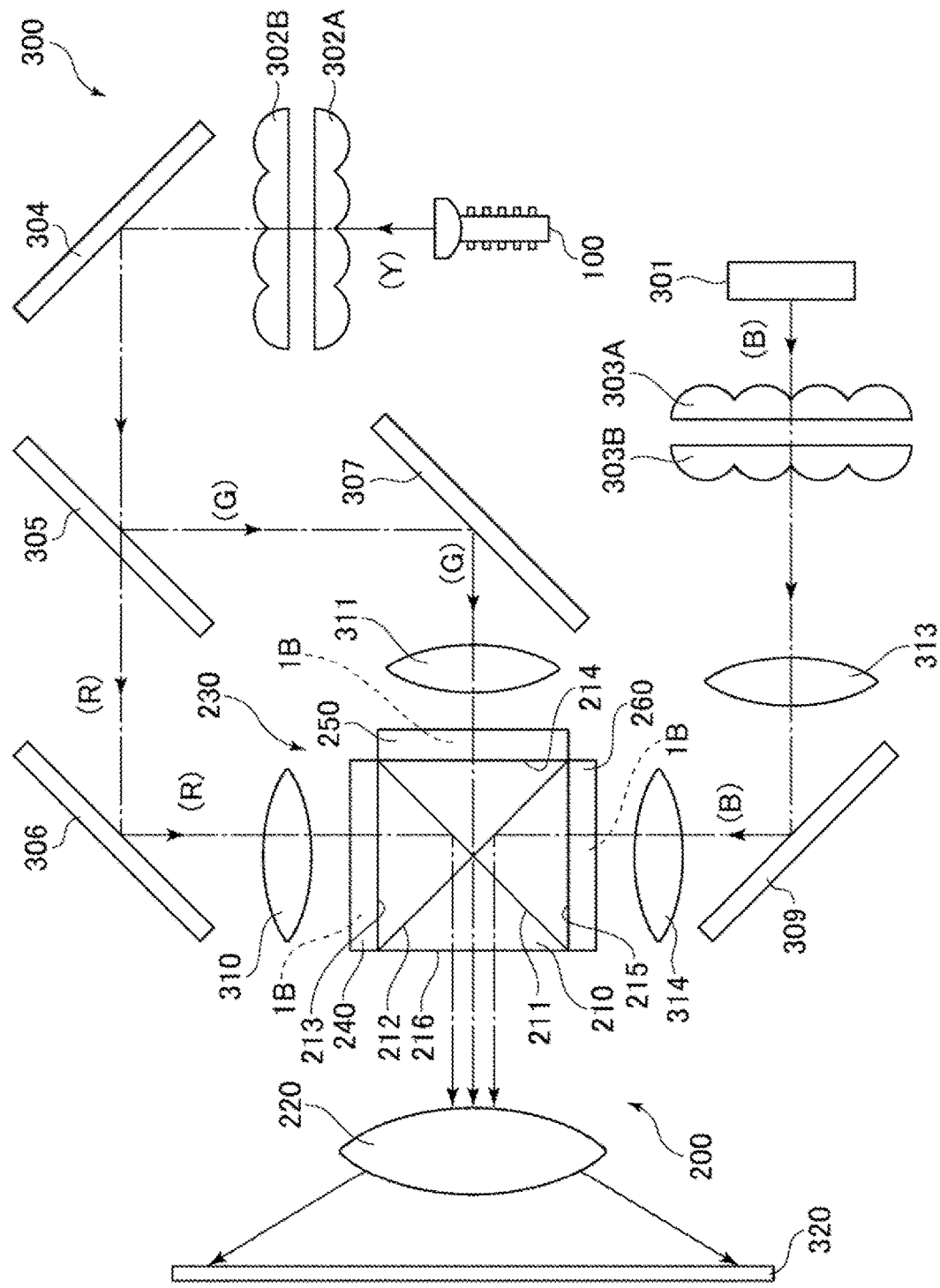
FIG. 6 is a diagram schematically illustrating an optical system of a liquid crystal projector to which an electronic apparatus of the present disclosure is applied.

FIG. 6 is a diagram schematically illustrating an optical system of a liquid crystal projector to which the electronic apparatus of the present disclosure is applied.

As illustrated in FIG. 6, a liquid crystal projector 300 includes a light source 301 for emitting blue light, the light source device 100 for emitting yellow light as the second wavelength range light, an illumination optical system including a plurality of integrator lenses, a color separation optical system (light-guiding optical system) including a plurality of dichroic mirrors or the like, a liquid crystal light valve 240 corresponding to a red color, a liquid crystal light valve 250 corresponding to a green color, a liquid crystal light valve 260 corresponding to a blue color, a dichroic prism 210 formed with a dichroic mirror surface 211 for selectively reflecting red light and a dichroic mirror surface 212 for selectively reflecting blue light, and a projection lens 220, and is a liquid crystal projector using the three liquid crystal light valves.

Additionally, the illumination optical system includes integrator lenses 302A, 302B, 303A, and 303B. The color separation optical system includes mirrors 304, 306, 307, 309, a dichroic mirror 305 that reflects blue light and green light, that is, selectively transmits red light, condensing lenses 310, 311, 313, and 314.

The liquid crystal light valve 250 includes a liquid crystal panel 1B. The liquid crystal light valves 240 and 260 are also constituted similarly to the liquid crystal light valve 250. The liquid crystal panel 1B included in each of the liquid crystal light valves 240, 250, and 260 is coupled to a driving circuit (not illustrated).

Note that, in the liquid crystal projector 300, an optical block 200 is constituted by the dichroic prism 210 and the projection lens 220. Additionally, a display unit 230 is constituted by the optical block 200, the liquid crystal light valves 240, 250, and 260 fixedly installed on the dichroic prism 210.

An operation of the liquid crystal projector 300 will be described below.

Yellow light emitted from the light source device 100 passes through the integrator lenses 302A and 302B. Light intensity (luminance distribution) of this yellow light is made uniform by the integrator lenses 302A and 302B. Additionally, blue light emitted from the light source 301 passes through the integrator lenses 303A and 303B. Light intensity or luminance distribution of this blue light is made uniform by the integrator lenses 303A and 303B.

The yellow light passing through the integrator lenses 302A and 302B is reflected by the mirror 304 to a left side in FIG. 6, green light (G) of the reflected light is reflected by the dichroic mirror 305 to a lower side in FIG. 6, and red light (R) passes through the dichroic mirror 305.

The red light passing through the dichroic mirror 305 is reflected by the mirror 306 to the lower side in FIG. 6, and the reflected light is shaped by the condensing lens 310, and enters the liquid crystal light valve 240 for red.

The green light reflected by the dichroic mirror 305 is reflected by the mirror 307 to the left side in FIG. 6.

The green light reflected by the mirror 307 is shaped by the condensing lens 311, and enters the liquid crystal light valve 250 for green.

Additionally, the blue light passing through the integrator lenses 303A and 303B is directed to the left side in FIG. 6, and is reflected by the mirror 309 to an upper side in FIG. 6. The above blue light is shaped by the condensing lenses 313 and 314, and enters the liquid crystal light valve 260 for blue.

In this manner, the yellow light emitted from the light source device 100 is subjected to color separation into the red light and the green light by the color separation optical system, the red light and the green light are guided to enter the liquid crystal light valves 240 for red and 250 for green respectively, and the blue light emitted from the light source 301 is guided to enter the liquid crystal light valve 260 for blue.

At this time, each pixel of the liquid crystal panel 1B included in the liquid crystal light valve 240 is subjected to on/off switching control, that is, modulated, by a driving circuit that operates based on an image signal for red.

Similarly, the green light and the blue light enter the liquid crystal light valves 250 and 260, respectively, and are modulated by the respective liquid crystal panels 1B, thereby forming an image for green and an image for blue. At this time, each pixel of the liquid crystal panel 1B included in the liquid crystal light valve 250 is subjected to switching control by a driving circuit that operates based on an image signal for green, and each pixel of the liquid crystal panel 1B included in the liquid crystal light valve 260 is subjected to switching control by a driving circuit that operates based on an image signal for blue.

Accordingly, the red light, the green light, and the blue light are modulated by the liquid crystal light valves 240 250, and 260, respectively, and each of an image for red, the image for green, and the image for blue is formed.

The image for red formed by the liquid crystal light valve 240, that is, the red light from the liquid crystal light valve 240, enters the dichroic prism 210 from a face 213, is reflected by the dichroic mirror surface 211 to the left side in FIG. 6, passes through the dichroic mirror surface 212, and is emitted from an emission surface 216.

Additionally, the image for green formed by the liquid crystal light valve 250, that is, the green light from the liquid crystal light valve 250, enters the dichroic prism 210 from a face 214, passes through each of the dichroic mirror surfaces 211 and 212, and is emitted from the emission surface 216.

Further, the image for blue formed by the liquid crystal light valve 260, that is, the blue light from the liquid crystal light valve 260, enters the dichroic prism 210 from a face 215, is reflected by the dichroic mirror surface 212 to the left side in FIG. 6, passes through the dichroic mirror surface 211, and is emitted from the emission surface 216.

In this way, the light of the respective colors from the liquid crystal light valves 240, 250, or 260, that is, the respective images formed by the liquid crystal light valves 240, 250, and 260, are synthesized by the dichroic prism 210, thereby forming a color image. This image is projected (enlarged and projected) by the projection lens 220, onto a screen 320 that is installed at a predetermined position.

Note that, the electronic apparatus of the present disclosure can also be applied, in addition to the liquid crystal projector having the configuration described above, to a DLP type projector including one Digital Micromirror Device (DMD). In other words, the light source device 100 can be used as a light source included in the DLP type projector.

Furthermore, the electronic apparatus according to the present disclosure can also be applied, in addition to the liquid crystal projector, to an electronic apparatus for which a liquid crystal projector such as a head-up display (HUD) or a head-mounted display (HMD) is applied. In addition, the light source device of the present disclosure can also be used as a light source for which directivity is required, such as automobile headlights, theater spotlights, and lighting devices used for illuminating buildings.

The light source device and the electronic apparatus in the present disclosure have been described above based on the illustrated exemplary embodiments, but the present disclosure is not limited thereto.

For example, in the light source device of the present disclosure, any of constitute elements may be replaced with any element capable of exhibiting similar functionality or an element in any configuration may be added.

In addition, in the light source device of the present disclosure, any two or more constitute elements described in the above-described first to fourth exemplary embodiments may be combined.

WORKING EXAMPLES

Specific working examples of the present disclosure will be described below. Note that, the present disclosure is not limited thereto.

1. Discussing Refractive Index in Inner Part 31 Included in Light Collector 30

1-1. Preparing Light Source Device

Working Example 1A

A light source device having an identical configuration to that of the light source device 100 described in the first exemplary embodiment was produced.

Then, by appropriately changing the type of the filler that fills the inner part 31 of the light collector 30 included in this light source device, those for which refractive index in the inner part 31 was set to be in a range of 1.0 or more to 2.0 or less were prepared.

Comparative Example 1A

A light source device was produced by constituting the emission surface 21 of the wavelength converter 20 in the light source device 100 described in the first exemplary embodiment by a planar surface, and omitting the formation of the reflective layer 35 included in the light collector 30.

Then, by appropriately changing the type of the filler that fills the inner part 31 of the light collector 30 included in this light source device, those for which refractive index in the inner part 31 was set to be in the range of 1.0 or more to 2.0 or less were prepared.

Comparative Example 2A

A light source device was produced by omitting the formation of the reflective layer 35 included in the light collector 30 in the light source device 100 described in the first exemplary embodiment.

Then, by appropriately changing the type of the filler that fills the inner part 31 of the light collector 30 included in this light source device, those for which refractive index in the inner part 31 was set to be in the range of 1.0 or more to 2.0 or less were prepared.

Note that, for any of Working Example 1A, Comparative Example 1A, and Comparative Example 2A, a light source device for which a refractive index of the wavelength converter 20 was 1.84 was prepared.

In addition, for the light source device of any of Working Example 1A and Comparative Example 2A, formation of the scattering part 50 on the emission surface 21 of the wavelength converter 20 was performed by elaborately arranging fine convex portions each forming a half sphere.

1-2. Measuring Light Extraction Efficiency, Etendu, and Projection Efficiency in Light Source Device of Comparative Example 1A For each of the light source devices of Comparative Example 1A, for which the refractive index in the inner part 31 was set to be in the range of 1.0 or more to 2.0 or less, light extraction efficiency, etendu, and projection efficiency were measured.

Note that, the light extraction efficiency refers to a ratio of fluorescent energy of the second wavelength range light extracted from the light collector 30 to excitation light energy of the first wavelength range light incident on the wavelength converter 20.

Figure 7:
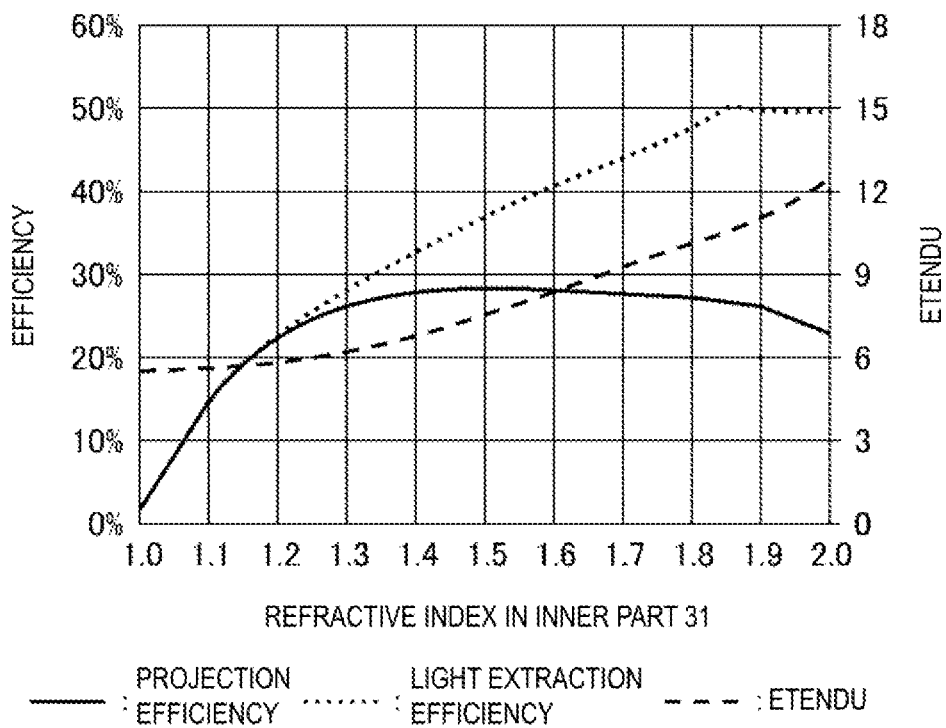
FIG. 7 is a graph showing relationships between refractive index in an inner part 31 of a light collector 30, and each of light extraction efficiency, etendu, and projection efficiency, in a light source device according to Comparative Example 1A.

As illustrated in FIG. 7 showing this measurement results, the light extraction efficiency increases in a range equal to or less than the refractive index of the wavelength converter 20 (n=1.84), as the refractive index in the inner part 31 of the light collector 30 increases. Additionally, in response to this, a result was shown in which the etendu also increased. This means that as the refractive index of the light collector 30 increases, light emitted from the light collector 30 spreads greatly.

Due to this, as illustrated in FIG. 7, a result was shown in which the projection efficiency reached a maximal value when the refractive index in the inner part 31 of the light collector 30 was about 1.55.

As described above, it was not a best means to simply increase the refractive index in the inner part 31 of the light collector 30, and a result was obtained from which adjusting the refractive index in a region of 1.55 or less was inferred to be advantageous.

1-3. Measuring Projection Efficiency in Each Light Source Device

The projection efficiency was measured for the light source devices of Working Example and each of Comparative Examples, for which the refractive index in the inner part 31 was set to be in the range of 1.0 or more and 2.0 or less.

Figure 8:
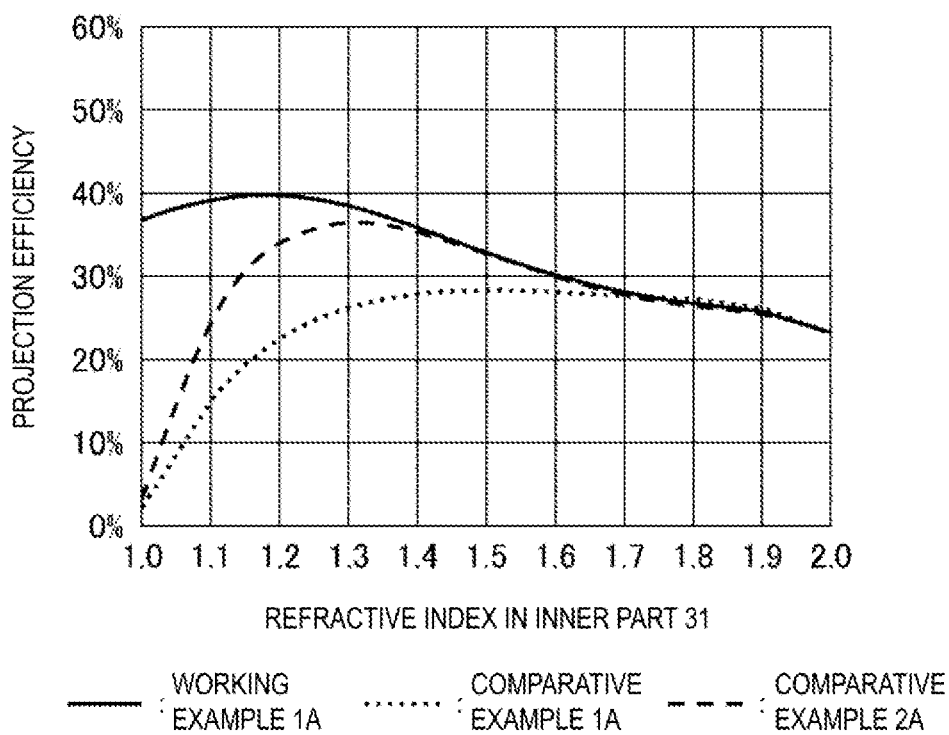
FIG. 8 is a graph showing relationships between projection efficiency and refractive index in the inner part 31 of the light collector 30, in respective light source devices according to Working Example 1A and Comparative Examples 2A, and the light source device according to Comparative Example 1A.

As illustrated in FIG. 8 showing this measurement results, when Comparative Example 2A in which the formation of the reflective layer 35 was omitted and the scattering part 50 was formed was compared with Comparative Example 1A in which the formation of the reflective layer 35 and the scattering part 50 was omitted, a result was obtained, by forming the scattering part 50 as in Comparative Example 2A, the projection efficiency was improved from 28.3% to 32.6% by 15.4% when the refractive index in the inner part 31 of the light collector 30 was 1.5, and further, 28.3% was improved to 36.5% by 29.1% when the above refractive index was 1.3.

Furthermore, when Working Example 1A in which the reflective layer 35 and the scattering part 50 were formed was compared with Comparative Example 2A in which the formation of the reflective layer 35 was omitted and the scattering part 50 was formed, a result was obtained, by further forming the reflective layer 35 as in Working Example 1A, in which improvement was not substantially observed when the refractive index in the inner part 31 of the light collector 30 was 1.5, but 28.3% was improve to 36.6% by 29.4% when the above refractive index was 1.0, and 28.3% was improved to 39.6% by 40.2% when the refractive index was 1.15.

In view of the above results, it became clear that the refractive index in the inner part 31 of the light collector 30 was to be set to preferably 1.0 or more and 1.4 or less, and more preferably to 1.1 or more and 1.3 or less, in order to improve the projection efficiency or the light extraction efficiency.

2. Discussing Haze (%) on Emission Surface 21 Included in Wavelength Converter 20

2-1. Preparing Light Source Device

Working Example 1B

A light source device having an identical configuration to that of the light source device 100 described in the first exemplary embodiment was produced.

Then, those for which haze (%) of the scattering part 50 constituted by the emission surface 21 included in the wavelength converter 20 provided in this light source device was set to be in a range of 0 or more to 100 or less were prepared.

Comparative Example 1B

A light source device was produced by constituting the emission surface 21 of the wavelength converter 20 in the light source device 100 described in the first exemplary embodiment by a planar surface, and omitting the formation of the reflective layer 35 included in the light collector 30.

Note that, for any of Example 1B and Comparative Example 1B, a light source device for which the refractive index of the wavelength converter 20 was 1.84, and the refractive index in the inner part 31 of the light collector 30 was 1.0 in Working Example 1B and 1.55 in Comparative Example 1B was prepared.

In addition, for the light source device of Working Example 1B, the formation of the scattering part 50 on the emission surface 21 of the wavelength converter 20 was performed by elaborately arranging fine convex portions each forming a half sphere.

2-2. Measuring Projection Efficiency in Each Light Source Device

The projection efficiency was measured for each of the light source devices of Working Examples, for which haze (%) of the scattering part 50 was set to be in the range of 0 or more and 100 or less. In addition, the projection efficiency was also measured for each of the light source devices of Comparative Examples.

Figure 9:
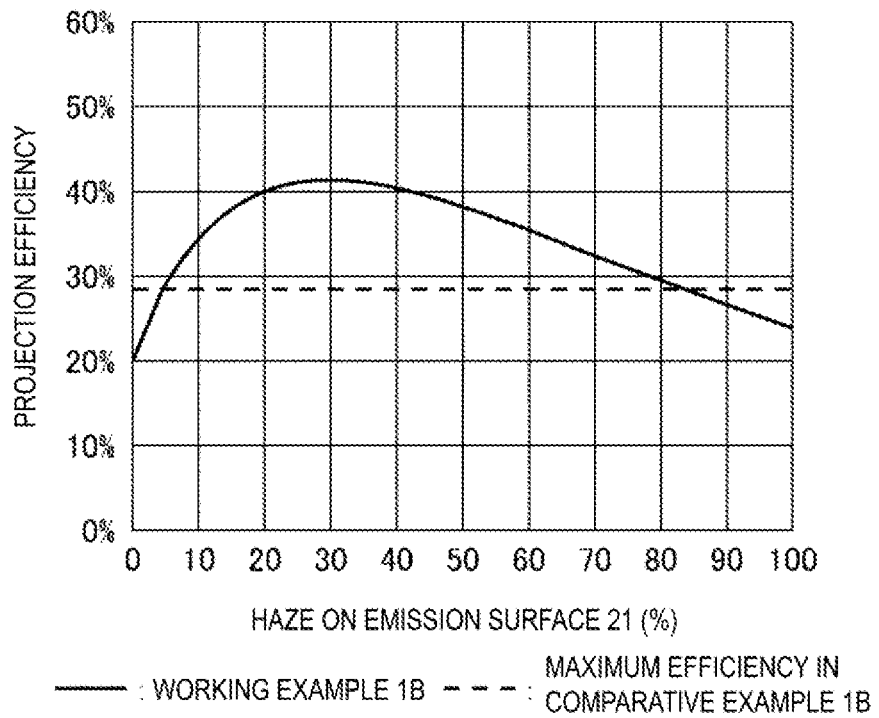
FIG. 9 is a graph showing a relationship between projection efficiency, and haze (%) on an emission surface 21 of a wavelength converter 20 in a light source device according to Working Example 1B.

As illustrated in FIG. 9 showing the measurement results, as in Working Example 1B, when the scattering part 50 was formed to change the haze, the projection efficiency was improved as the haze (%) increased from 0 (zero), but a tendency was shown in which the projection efficiency rather decreased when the haze (%) was too large.

This decrease in the projection efficiency was caused by the haze (%) becoming too large. In other words, when scattering of the second wavelength range light by the scattering part 50 was too large, backscattering of the light, that is, scattering of reflected light, was also strengthened. As a result, the light was absorbed in the wavelength converter 20, or emitted from the incident surface 22.

Thus, when Working Example 1B in which the reflective layer 35 and the scattering part 50 were formed was compared to Comparative Example 1B in which the formation of the reflective layer 35 and the scattering unit 50 was omitted, the projection efficiency in Comparative Example 1B when the refractive index in the inner part 31 was 1.55, or maximum efficiency, was shown by a dotted line in FIG. 9. Thus, it became clear that in order to obtain higher projection efficiency than this in the light source device of Working Example 1B, the haze (%) in the scattering part 50 may be set to from 5% to 85%, and more preferably from 15% to 60% or less, and even more preferably about 30%.

Note that, impact on the haze (%) when the refractive index in the inner part 31 of the light collector 30 was changed was simulated.

Figure 10:
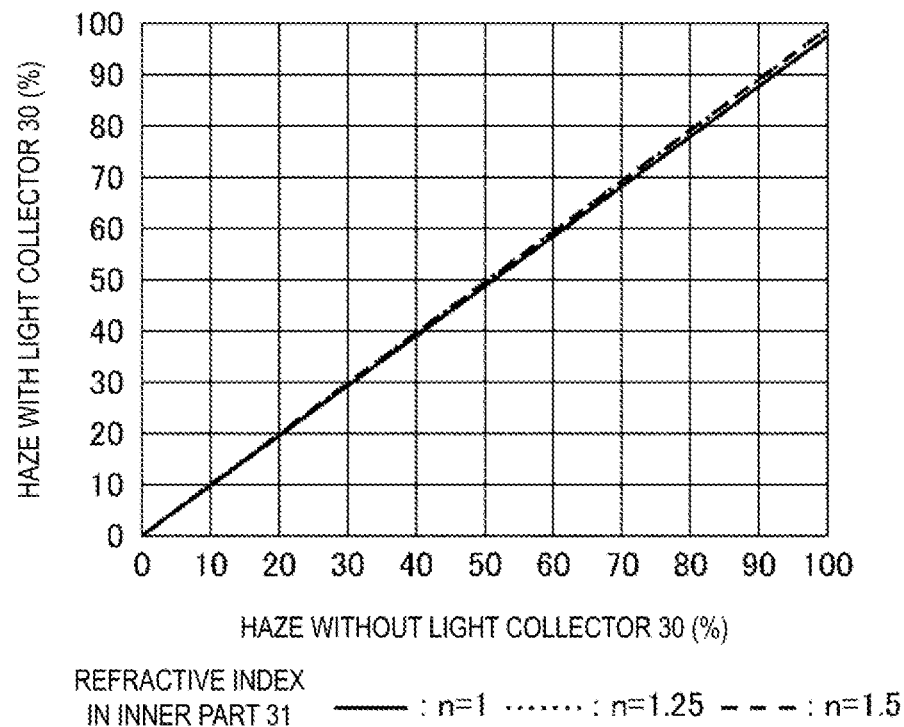
FIG. 10 is a graph showing a relationship between haze (%) when the light collector 30 is included and haze (%) when the light collector 30 is not included.

A graph was illustrated in FIG. 10 in which haze was plotted on a horizontal axis when the light collector 30 was not included and haze was plotted on a vertical axis when the light collector 30 was included.

As shown in FIG. 10, a result was shown in which, in an area with the haze being small, even when the light collector 30 was included, a value of the haze (%) was hardly affected, and major impact was not observed even in an area with the haze being large. In addition, also when magnitude of the refractive index in a space of the light collector 30 was changed, substantially similar results were exhibited regardless of the magnitude of the refractive index. Therefore, it was found that, even when the light collector 30 was formed in the light source device 100 to change the refractive index in the inner part 31 of the light collector 30, the magnitude of the haze (%) on the emission surface 21, that is, a degree of scattering on the emission surface 21 was not affected.

What is claimed is:

1. A light source device, comprising:
a light-emitting body configured to emit first wavelength range light,
a wavelength converter that includes an incident surface on which the first wavelength range light is incident, and an emission surface configured to emit, after the first wavelength range light is converted to second wavelength range light, the second wavelength light, the incident surface being larger than the emission surface,
a light collector including a light input part configured to enter the second wavelength range light, and
a scattering part disposed on the emission surface of the wavelength converter or on the light collector side of the emission surface, wherein
the light collector includes a first reflective layer configured to reflect the second wavelength range light entered by the light input part,
the light collector has a main body having a cylindrical shape, the main body has a first open part on a base end side that constitutes the light input part, and a second open part on a tip side that constitutes an output part configured to emit the second wavelength range light, the first reflective layer is formed at the main body, the first open part is provided to the incident surface via a second reflective layer so that the wavelength converter protrudes inside the main body, and the second wavelength range light passes through and is diffused by the scattering part, after passing through the first open part.

2. The light source device according to claim 1, wherein a haze of the scattering part is from 5% to 85%.

3. The light source device according to claim 1, wherein a refractive index of the light collector is from 1.0 to 1.4.

4. The light source device according to claim 1, wherein a refractive index of the wavelength converter is greater than a refractive index of the light collector.

5. The light source device according to claim 1, wherein the wavelength converter is disposed to extend through an open part on the base end side so that an end portion of the wavelength converter on the light collector side is located inside the main body.

6. An electronic apparatus, comprising:

the light source device according to claim 1.

* * * * *